(12) United States Patent
Park

(10) Patent No.: US 9,615,462 B2
(45) Date of Patent: Apr. 4, 2017

(54) CAPACITIVE TOUCH SENSOR INTEGRATED WITH WINDOW PANEL AND FABRICATION METHOD THEREOF

(71) Applicant: Jae Bum Park, Daegu (KR)

(72) Inventor: Jae Bum Park, Daegu (KR)

( * ) Notice: Subject to any disclaimer, the term of this patent is extended or adjusted under 35 U.S.C. 154(b) by 176 days.

(21) Appl. No.: 14/258,033

(22) Filed: Apr. 22, 2014

(65) Prior Publication Data

US 2014/0217059 A1   Aug. 7, 2014

Related U.S. Application Data

(62) Division of application No. 13/001,618, filed as application No. PCT/KR2009/001610 on Mar. 30, 2009, now abandoned.

(30) Foreign Application Priority Data

Jun. 27, 2008   (KR) .................. 10-2008-0061434

(51) Int. Cl.
*H03K 17/975* (2006.01)
*H05K 3/06* (2006.01)
(Continued)

(52) U.S. Cl.
CPC ............... *H05K 3/06* (2013.01); *G06F 3/044* (2013.01); *G06F 3/0412* (2013.01)

(58) Field of Classification Search
CPC ............... H01H 1/00; H01H 13/70; H01H 13/702–13/704; H01H 2239/074; H01H 2203/008; H01H 2207/01; H01H 2221/00; H01H 2231/002; H01H 2231/012; H01H 2231/016; H01H 2231/052; H01H 2239/006; H01H 25/00; H01H 25/04; G06F 3/0412; G06F 3/045; H03K 17/975
USPC .. 345/173; 200/5 R, 5 A, 341, 600, 46, 292, 200/243; 29/592, 623.5, 829, 874, 877, 29/402.18, 428, 458, 469.5, 527.2; 427/284, 287, 258, 256, 261, 264, 270, 427/271, 64, 77
See application file for complete search history.

(56) References Cited

U.S. PATENT DOCUMENTS 4,855,550 A * 8/1989 Schultz, Jr. ............. F24C 7/082
200/600
6,605,789 B2   8/2003 Chen et al.
(Continued)

FOREIGN PATENT DOCUMENTS

KR   10-2007-0067875 A   6/2007

OTHER PUBLICATIONS

International Search Report for PCT/KR2009/001610 mailed Nov. 13, 2009.

*Primary Examiner* — Anthony R. Jimenez
(74) *Attorney, Agent, or Firm* — Revolution IP, PLLC

(57) ABSTRACT

Disclosed is a capacitive touch sensor integrated with window panel, comprising: a transparent window panel substrate 311; a non-conductive opaque decorative layer 312 formed on a surface of said substrate along edges of the surface to define a transparent window area W on said substrate; a transparent conductive electrode pattern layer 313 formed over the window area of said substrate and said decorative layer; and a conductive wiring layer 314 formed at an edge of top surface of said transparent conductive electrode pattern layer 313.

10 Claims, 5 Drawing Sheets

(51) Int. Cl.
*G06F 3/041* (2006.01)
*G06F 3/044* (2006.01)

(56) References Cited

U.S. PATENT DOCUMENTS

| | | |
|---|---|---|
| 6,717,083 B2 | 4/2004 | Chen et al. |
| 6,765,629 B1 | 7/2004 | Jeong et al. |
| 7,417,202 B2 | 8/2008 | Parkinson |
| 7,642,479 B2 | 1/2010 | Lin et al. |
| 7,920,129 B2 | 4/2011 | Hotelling et al. |
| 2007/0249141 A1 | 10/2007 | Lee et al. |
| 2008/0277259 A1* | 11/2008 | Chang ............... G06F 3/044 200/600 |

* cited by examiner

CAPACITIVE TOUCH SENSOR INTEGRATED WITH WINDOW PANEL AND FABRICATION METHOD THEREOF

CROSS REFERENCE TO PRIOR APPLICATIONS

This application is a Divisional Application of U.S. patent application Ser. No. 13/001,618 filed on Dec. 27, 2010 under 35 U.S.C. §120, which is a National Stage Patent Application of PCT International Patent Application No. PCT/KR2009/001610 filed on Mar. 30, 2009 under 35 U.S.C. §371, which claims priority to Korean Patent Application No. 10-2008-0061434 filed on Jun. 27, 2008, which are all hereby incorporated by reference in their entirety.

TECHNICAL FIELD

The present invention relates to a capacitive touch sensor and, more particularly, to a capacitive touch sensor integrated with window panel and its manufacturing method.

Touch sensors are widely being used in portable electronic devices such as a cellular phone, a personal digital assistant (PDA) and a MP3 player as input units. The touch sensors can be classified into a resistor type and a capacitor type touch sensors. The capacitor type touch sensor, which reveals higher reliability and facilitates multiple-touch sensing function, has been being employed widely in cellular phones.

BACKGROUND ART

FIG. 1 is a perspective view of a cellular phone equipped with a conventional capacitive touch sensor module 110, and FIG. 2 is a cross sectional view of the cellular phone in which the touch sensor is installed.

A conventional cellular phone 100 includes an upper casing 101, a touch sensor module 110, and a lower casing 102. In the upper casing 101 a support member 101a is formed surrounding a center opening, and the touch sensor module 110 is installed on the support member 101a. A switch button 120 is installed on a front face of the upper casing 101. A display 140 and a main printed circuit board (PCB) 150 are installed inside the lower casing 102. The display 140 is disposed beneath the touch sensor 110. Even though being not shown in the drawings, a flexible printed circuit (FPC) for signal transmission is electrically connected to the touch sensor module 110 and the main PCB 150. A speaker 130 is installed in the upper casing 101, and a microphone 140 is installed on an external surface of the upper casing 101.

One of recent structural design trends is to make the level of the front face of the touch sensor even with that of the upper casing in order to ease assembly operation and attain a better esthetic view. For this purpose, the support member 101a is formed in such a manner that a step having the same height as the thickness of the touch sensor module 110 is provided at the perimeter of the center opening. The front face of the touch sensor module 110 can be divided into a transparent window area W for showing an image to be displayed through the display 140 and a decoration region D surrounding the window area. The transparent window area W is used also for receiving touch inputs. The decoration region D is used for printing a trademark or a logo of a phone manufacturer while hiding opaque interconnection pattern residing in the vicinity of an edge of the touch sensor.

DISCLOSURE

Technical Problem

FIG. 3 illustrates a process of manufacturing a conventional touch sensor module 200. As shown in the drawing, the touch sensor module 200 includes a window panel 211 and a touch sensor 220 attached beneath the window panel 211.

The window panel 211 typically is made of tempered glass or transparent acrylic panel. An opaque decorative layer 212 is coated beneath a bottom surface of the window panel 211. (Refer to FIG. 3(h).) The coating of the opaque decorative layer 212 is carried out by a silk screen printing method or depositing non-conductive material.

The process of manufacturing the capacitive touch sensor 220 will now be described. A transparent conductive film 215 is coated on a top surface of a substrate 216 made of glass or polyethylene terephthalate (PET) film. The coating of the transparent conductive film 215 is accomplished by spluttering or evaporation of indium tin oxide (ITO), indium zinc oxide (IZO), zinc oxide (ZnO) or cadmium tin oxide (CTO). (Refer to FIG. 3(b).) Subsequently, the transparent conductive film 215 is partially removed for forming a transparent electrode pattern 215. (Refer to FIG. 3(c).) The formation of the transparent electrode pattern can be performed by photolithography or laser processing. Afterwards, a conductive wiring pattern 214 is coated for electrically connecting the transparent electrode pattern to an external circuit. (Refer to FIG. 3(d).) The coating of the conductive wiring pattern 214 is performed by the silk screen printing method. Afterwards, an adhesive 213, e.g., pressure sensitive adhesive (PSA), is coated, and the touch sensor 220 is bonded to the window panel substrate 211. The FPC 218 to be electrically connected to the touch sensor 200 is connected to an end of the conductive wiring pattern 214 by use of anisotropic conductive film (ACF).

The touch sensor module 200 is finished by bonding the capacitive touch sensor 200 to the window panel 211 printed with the decorative layer 212 as described above. At this time, the opaque conductive wiring pattern 214 and the dead zone of the touch sensor are preferably placed below the decoration region D.

The touch sensor module 200 fabricated by the above process has the following problems.

First, air bubbles 217 may remain under the window area or contaminants may be introduced in the course of bonding of the window panel 211 and the touch sensor 220, which may results in defects in the touch sensor module 200. Particularly, the air bubbles are introduced due to the difference in the height level between the bottom of the opaque decorative layer 212 and the bottom surface portion of the window area W beneath which the decorative layer is not printed.

Second, another defect may occur because of the misalignment between the window panel and the touch sensor which stems from a difference in contraction coefficients and an alignment error.

Third, the process requires the process step of bonding the window panel 211 and the touch sensor, along with related facility investment. Complex manufacturing process is prone to increase the possibility of defects and requires more operators, which in turn increases manufacturing costs.

Fourth, the substrate 216, which is additionally provided aside from the window panel 211 of which strength may secure the protection of the display 140, increases the thickness of the touch sensor module and material costs.

Even worse, the increased thickness of the touch sensor reduces the touch sensitivity and deteriorates the light transmission ratio of the touch sensor module.

In order to solve the problems above, one object of the present invention is to provide a touch sensor having a new structure for reducing its thickness so as to facilitate implementation of a slim electronic device. Another object of the present invention is to provide a method of manufacturing a touch sensor having a new slim structure.

The above objects are achieved by a method of manufacturing a touch sensor integrated to a window panel, which is described below.

Technical Solution

The capacitive touch sensor integrated with window panel according to an aspect of the present invention includes a transparent window panel substrate; a non-conductive opaque decorative layer formed on a surface of the substrate along the edges of the surface to define a transparent window area W on the substrate; a transparent conductive electrode pattern layer formed over the window area of the substrate and the decorative layer; and a conductive wiring layer formed at an edge of top surface of the transparent conductive electrode pattern layer. The conductive wiring layer is disposed in such a manner that it is concealed by the opaque decorative layer.

In order to prevent the transparent electrode pattern from being seen from the outside due to the difference in refraction index between the transparent electrode pattern layer and the window substrate, it is preferable to additionally provide an anti-reflection layer covering the transparent electrode pattern layer.

The phenomenon that the electrode pattern is seen from the outside can be decreased by coating silicon dioxide ($SiO_2$) on the window panel substrate on which the decorative layer is formed, instead of coating of the anti-reflection layer. In such a case, the transparent conductive electrode pattern is formed over the $SiO_2$ film. The $SiO_2$ film is 30-2000 angstroms thick.

Additionally, it is preferable to coat a scattering prevention layer on the anti-reflection layer or over the transparent conductive electrode pattern layer so as to protect the transparent conductive electrode pattern and the conductive wiring layer while preventing shards of the window panel from scattering away when the window panel substrate is broken.

The non-conductive opaque decorative layer can be formed by screen printing of non-conductive ink on the window panel substrate. Alternatively, the non-conductive non-transparent decorative layer can be formed by screen printing of non-conductive metallic alloy, non-conductive metallic oxide, or non-conductive metallic nitride on the window panel substrate, and then carrying out screen printing of non-conductive ink on the coated non-conductive film to define the window area W.

The transparent conductive electrode pattern layer can be formed by use of one among indium tin oxide (ITO), indium zinc oxide (IZO), zinc oxide (ZnO), and cadmium tin oxide (CTO).

A method of manufacturing a capacitive touch sensor integrated with window panel according to another aspect of the present invention includes steps of: providing a transparent window panel substrate; providing a non-conductive opaque decorative layer on a surface of the window panel substrate along edges of the surface to define a transparent window area W on the window panel substrate; coating a transparent conductive electrode thin film over the window area W and the decorative layer D; forming a transparent conductive electrode pattern by partially removing of the conductive electrode thin film; and coating a conductive wiring layer at an edge of the transparent conductive electrode pattern.

The non-conductive opaque decorative layer can be formed by silk printing of non-conductive ink directly on the window panel substrate. In an alternative embodiment for improving the esthetic view of the decorative layer, the decorative layer can be formed by coating of non-conductive metallic alloy, non-conductive metallic oxide, or non-conductive metallic nitride on the window panel substrate, and then screen printing of non-conductive ink for defining the window area W on the coating film. In this case, the non-conductive coating film on the window area W is removed by etching. The non-conductive metallic oxide includes $TiO_2$ or $SiO_2$. The non-conductive metallic alloy includes Tin or silicon aluminum alloy.

In an alternative embodiment, the method of the present invention may further include a step of coating an anti-reflection layer over the transparent electrode pattern and the conductive wiring layer. The anti-reflection layer can be coated by a sputtering or an evaporation method.

A $SiO_2$ film may be coated on the window panel substrate on which the decorative layer is formed, before the conductive electrode thin film is coated. In case that an electrode pattern is formed on the $SiO_2$ film, the $SiO_2$ film can prevent the electrode pattern from being seen from the outside even without the anti-reflection layer. It is preferable that the thickness of the $SiO_2$ film ranges from 30 to 2000 angstroms.

In an alternative embodiment where a tempered glass is used for the window panel substrate, it is preferable to coat the scattering prevention layer 115 after the reflection prevention layer is coated. The scattering prevention layer can be coated by using silk screen printing.

Advantageous Effects

As the touch sensor is integrated with the window panel, no additional substrate (e.g., ITO-coated PET film or ITO-coated glass substrate) is needed and the thickness of the touch sensor can be reduced. In other words, the touch sensor of the present invention is slimmer while revealing superior light transmission ratio than a conventional touch sensor. In addition, the touch sensor according to the present invention does not require any adhesive for bonding to the substrate, which reduces its manufacturing costs.

The method of manufacturing a touch sensor according to the present invention, which forms a capacitive touch sensor directly on the window panel coated with a decorative layer, prevents defects due to air bubbles and contaminants which were likely to be introduced when the touch sensor was bonded to the window panel under the conventional method. In addition, the present invention basically eliminates the misalignment problem which was prone to occur in the course of bonding process under the conventional method. Elimination of the process of bonding the window panel and a touch sensor simplifies the overall manufacturing process and reduces the defects and manufacturing costs. The process of the present invention does not require any separate equipment for bonding the window panel and the touch sensor, which further reduces costs for the equipment investment.

<Brief descriptions of reference numerals>

| | |
|---|---|
| 200: touch sensor module | 211, 311: window panel substrate |
| 212, 312: decorative layer | 213: adhesive (PSA) |
| 214: wire pattern layer | 215: conductive electrode pattern layer |
| 216: substrate (PET film) | |
| 310: window panel integrated capacitive touch sensor | 313: conductive electrode pattern layer |
| 314: wiring layer | 315: anti-reflection layer |
| 316: scattering prevention layer | |

BEST MODES FOR CARRYING OUT THE INVENTION

Figure 1:
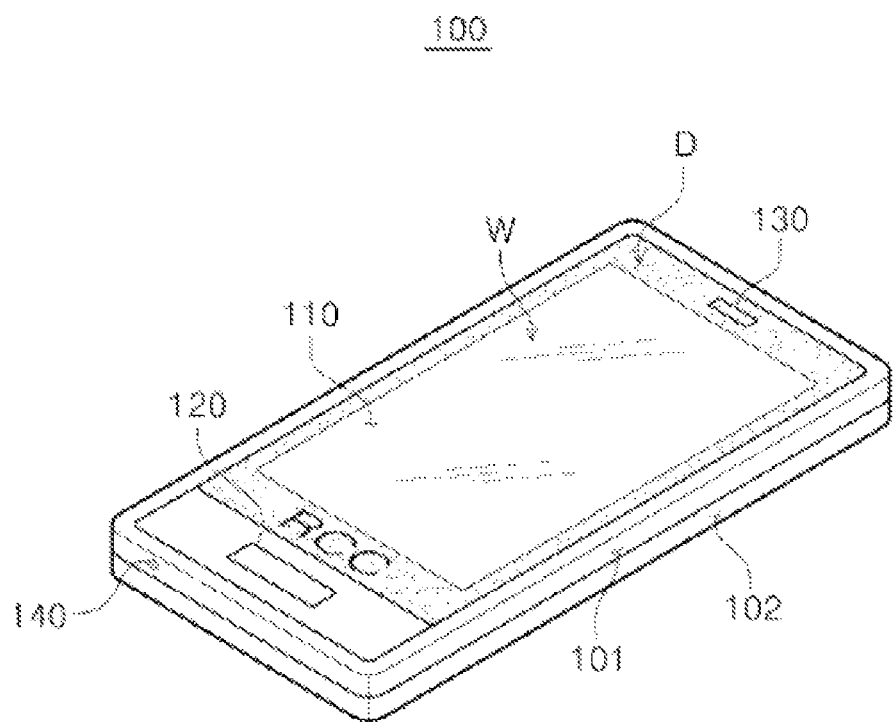
FIG. 1 is a perspective view of a cellular phone having a capacitive touch sensor.
Figure 2:
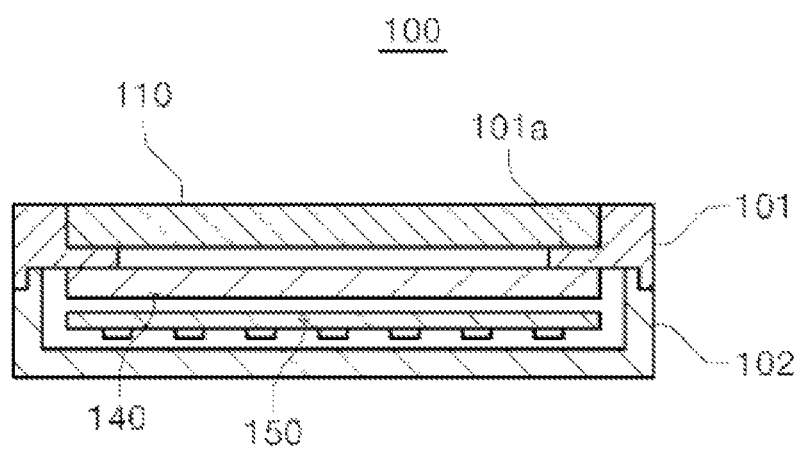
FIG. 2 is a cross sectional view of a cellular phone in which a touch sensor is installed.
Figure 3:
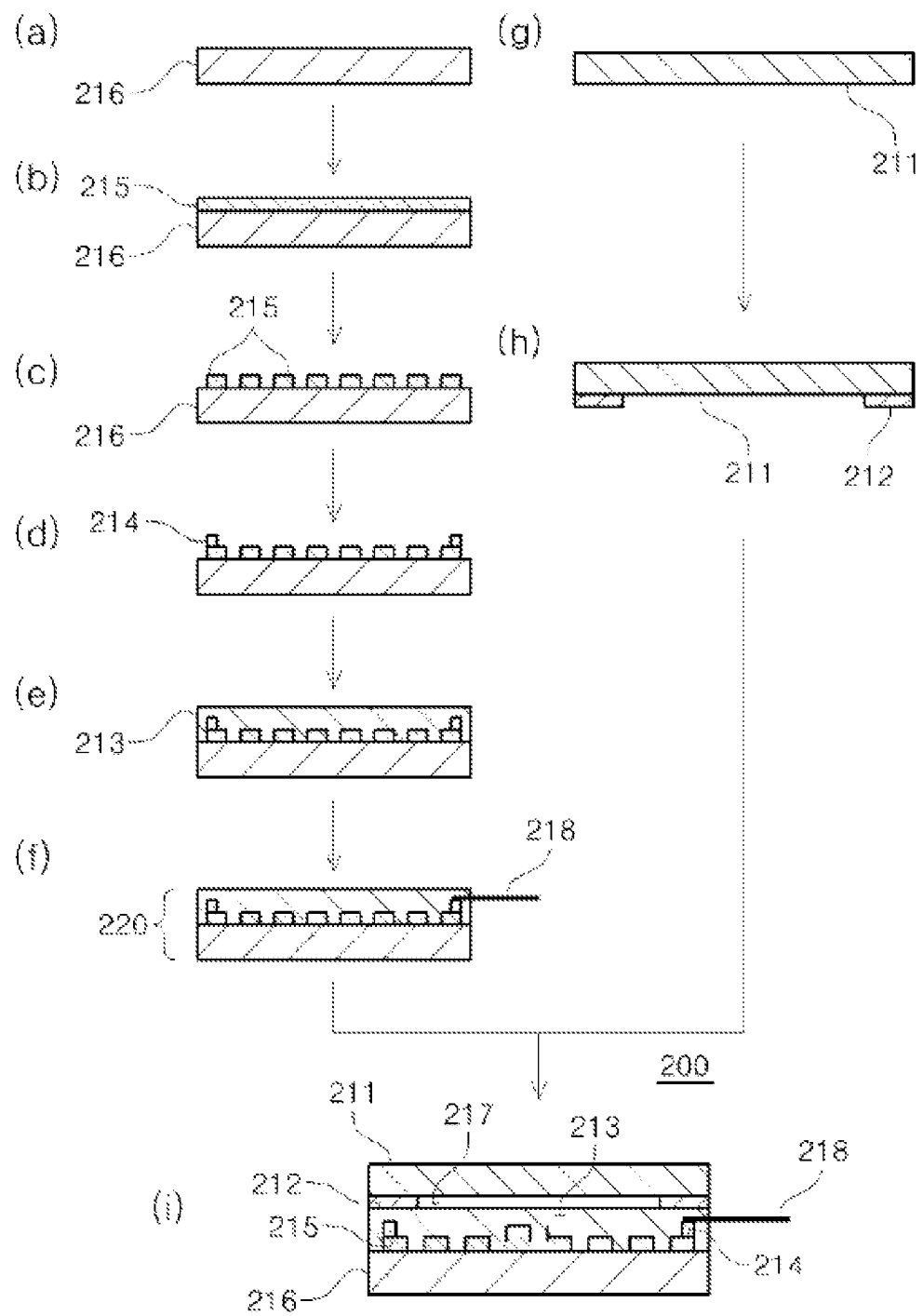
FIG. 3 illustrates a process of manufacturing a conventional touch sensor assembly comprised of a touch window and a capacitive touch sensor.
Figure 4:
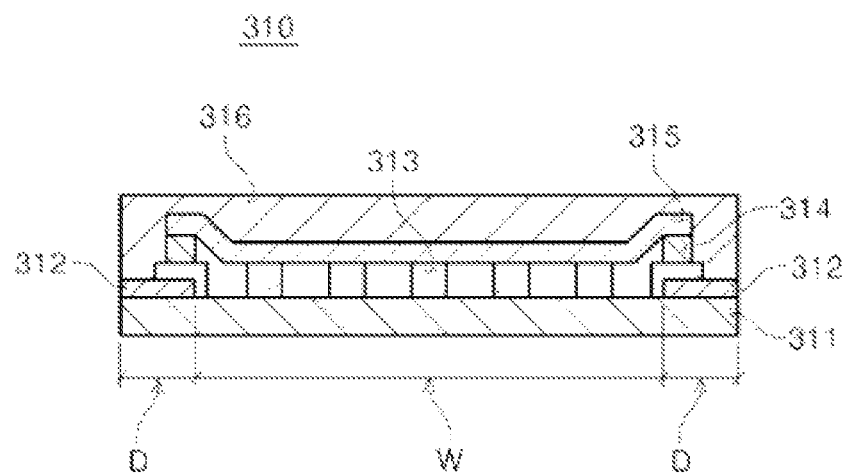
FIG. 4 is a schematic view illustrating a structure of a capacitive touch sensor integrated with window panel according to the present invention.
Figure 5:
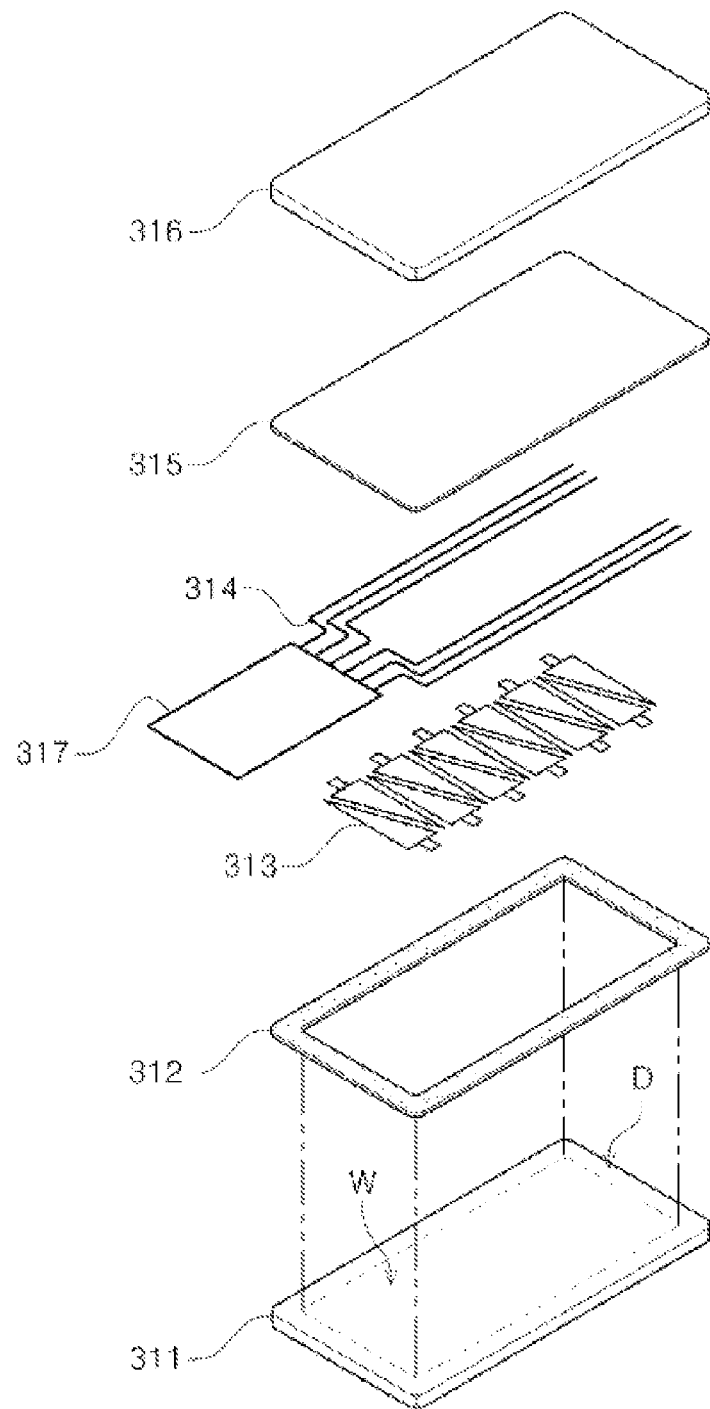
FIG. 5 is an exploded perspective view illustrating a structure of the capacitive touch sensor integrated with window panel according to the present invention.

FIG. 4 is a schematic view illustrating the structure of a capacitive touch sensor integrated with window panel according to the present invention, and FIG. 5 is an exploded perspective view of the capacitive touch sensor integrated with window panel according to the present invention.

The capacitive touch sensor integrated with window panel according to an embodiment of the present invention will be described with reference to FIGS. 4 and 5.

The touch sensor 310 of the present invention includes a window panel substrate 311 composed of tempered glass, a decorative layer 312 coated on an edge of a top surface of the window panel substrate 311, and a transparent and conductive electrode pattern layer 313 coated on the top surface of the window panel substrate 311. A conductive wiring layer 314 is coated on an edge of the top of the electrode pattern layer 313. An anti-reflection layer 315 is coated to cover the electrode pattern layer 313, and a scattering prevention layer 315 is coated on the anti-reflection layer.

The window panel substrate 311 is composed of transparent acryl or tempered glass. In case that the window panel substrate 311 is made of an acrylic board, the coating of the scattering prevention layer 315 is not needed. A non-transparent decorative layer 312 coated with insulating material is formed along the edge of an upper side of the window panel substrate 311 in such a manner that the transparent touch region W is arranged in central portion of the window panel substrate 311. The decorative layer 312 defines the decoration region D of the window panel 311.

In the present embodiment, the decorative layer 312 is formed by coating non-conductive metal such as Tin and silicon aluminum alloy into a thin film form or coating non-conductive oxide (stacked layers of titanium dioxide ($TiO_2$) and silicon dioxide ($SiO_2$), for example) into a thin film form, printing non-conductive ink in the decoration region D, and etching away the non-conductive thin film from the window area W. A decoration pattern such as a trademark and a logo can be printed in the decorative layer 312. A colored printing may be performed as well to generate a colored pattern. In an alternative embodiment, the decorative layer 312 can be formed by printing the non-conductive ink directly on the top surface of the window panel substrate 311. In the present embodiment, the transparent electrode pattern layer 313 partially covers the decorative layer 312 as well as the entire window area W. Alternatively, however, the electrode pattern layer 313 may cover the entire portions of both the window area W and the decorative layer 312. The electrode pattern layer 313 is formed by sputtering indium tin oxide (ITO) to deposit ITO thin film as shown in FIG. 6(d) and selectively removing the ITO thin film by photolithography. Instead of ITO, indium zinc oxide (IZO), antimony zinc oxide (AZO), zinc oxide (ZnO) or cadmium tin oxide (CTO) can be used for forming the electrode pattern layer 313.

The conductive wiring layer 314 is coated on the top of the electrode pattern layer 313 in the area where the decoration region D is defined. The conductive wiring layer 314 is concealed by the non-transparent decorative layer 312 so as not to be seen from the outside. The conductive wiring layer 314 is formed by silk screen printing of conductive ink. Alternatively, in order to increase the window area W, the wiring layer 314 may be formed by coating a metallic thin film by spluttering deposition and a subsequent selective removal by photolithography. In order to secure the transparent window area W, the wiring layer 314 formed by use of non-transparent ink is disposed only in the decoration region D. Accordingly, some edges of the transparent electrode pattern layer 313 extends to the decoration region D, and the conductive wiring layer 314 of the decoration region D is coated on the edges of the transparent electrode pattern layer 313.

The anti-reflection layer, which utilizes the phenomenon of destructive interference of lights, is coated on the conductive transparent electrode pattern layer 313 to prevent the electrode pattern from being seen from the outside due to the difference in the refraction index between the transparent electrode pattern 313 and the window substrate 311. The anti-reflection layer is formed by sputtering or evaporation of titanium dioxide ($TiO_2$) or silicon dioxide ($SiO_2$) under vacuum environment.

Instead that the anti-reflection layer 315 is deposited on the transparent electrode pattern 313, a silicon dioxide ($SiO_2$) thin film can be deposited on the window panel substrate 311 after the decorative layer 312 is formed, and then the ITO electrode pattern can be formed on the silicon dioxide thin film in an alternative embodiment of the present invention.

The scattering prevention layer 316 protects the transparent electrode pattern layer 313 and the wiring layer 314 and prevents shards of glass from being scattered away when the window panel substrate 311 made of tempered glass is broken. The scattering prevention layer 316 is formed by printing UV-curable resin and radiating ultraviolet light.

Reference numeral 317 denotes a flexible printed circuit (FPC) to be electrically connected to the touch sensor, and is connected to a terminal of the wiring layer 314 by use of an anisotropic conductive film (ACF).

The touch sensor integrated with window panel 310 according to the present invention can be made thinner than the conventional touch sensor module 200 and allows the reduction of manufacturing costs through the decrease in the process defects and the number of process steps. Namely, the conventional touch sensor module 200 having a stacked structure of the substrate (i.e., ITO-coated PET film or ITO-coated glass substrate), the ITO pattern layer, the electrode pattern layer, the reflection prevention layer, the adhesive layer (PSA), the decoration printing layer, and the window panel substrate, require complicated manufacturing process. To the contrary, the touch sensor 310 of the present invention fabricated integratedly to the window panel simplifies the fabrication process by means of removing the process step of attaching the touch sensor to the window panel. Since the adhesive layer (PSA) and the substrate (i.e., ITO-coated PET film or ITO-coated glass substrate) are not needed, the touch sensor of the present invention can be made thinner. Further, product defects due to air bubbles, contaminants, or misalignment problems can be eliminated.

Figure 6:
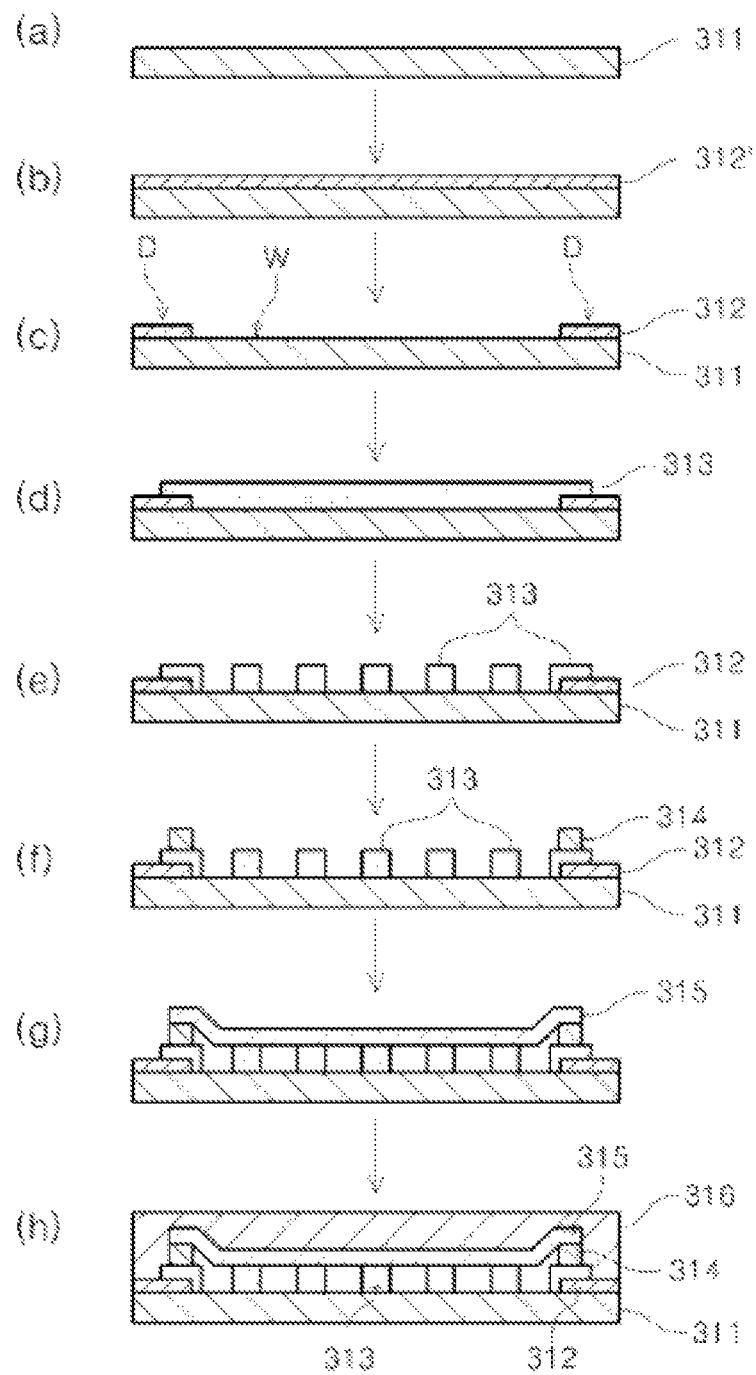
FIG. 6 illustrates a process of manufacturing the capacitive touch sensor integrated with window panel according to the present invention.

The process for manufacturing the touch sensor integrated with window panel will be described below. FIG. 6 illustrates the manufacturing process of the touch sensor integrated with window panel according to the present invention.

First, a tempered glass substrate or an acrylic substrate of an appropriate size is prepared as shown in FIG. 6(a).

Next, on the substrate is coated a non-conductive film 312' for forming the decorative layer 312 as shown in FIG. 6(b). The coating of the non-conductive film 312' is accomplished by depositing non-conductive metal or non-conductive oxide or nitride under vacuum environment.

Subsequently, the decorative layer 312 is formed by printing non-conductive ink on the non-conductive film 312' by use of a silk screen printing machine and drying for 60 minutes at 80° C. by use of an air heating drier. After the printed decorative layer 312 is completely dried, an etchant is applied to remove the non-conductive thin film deposited on the window area W while leaving the non-conductive thin film coated on the decorative layer 312 as shown in FIG. 6(c). Though the printed decorative layer 312 is a few hundred times thicker than the non-conductive film 312', the ratio of thicknesses is not reflected in FIG. 6 for the sake of simplicity in the visual description.

Though the decorative layer 312 is formed by depositing the non-conductive film 312', printing the decorative layer 312, and etching the non-conductive film 312' in the preferred embodiment, the decorative layer can be formed by direct printing of the non-conductive ink on the window panel by use of the silk screen printing machine without the intervention of the non-conductive film 312'. The printed decorative layer 312 is dried at 80° C. for 60 minutes in the heat air drier. An infrared (IR) radiator may be used for the drier as well.

Afterwards, a transparent and conductive thin film (e.g., ITO film 313') is coated on the window area W and the decorative layer 312 as shown in FIG. 6(d). It is preferable that the ITO film 313' has a sheet resistance ranging from 100 to 700 ohms/sq and has a visible light transmission coefficient larger than 87%. Since the method of coating the ITO film 313' is the same as that for a conventional capacitive touch sensor, detailed description thereof will be omitted. Nonetheless, however, it should be noted that the technical idea of coating the ITO film directly on the window panel substrate 311 having the decorative layer 312 on it to form an electrode pattern is novel and requires an intensive change of conception. In particular, because the ITO film 313' having a typical thickness of 0.01 to 0.1 micrometer is much thinner than the printed decorative layer 312 having a thickness in the order of 10 micrometer, the concept of coating the ITO film directly on the window panel substrate having the decorative layer on it and then selectively etching to form the electrode pattern has never been explored. The inventor of the present invention has found that it is possible to manufacture the window panel integrated touch sensor by coating the ITO film 313' on the window panel substrate having the decorative layer on it so carefully that the ITO film shows uniform sheet resistance and sufficient visible light transmission coefficient despite of the enormous thickness difference between the printed decorative layer 312 and the window area.

Subsequently, the transparent electrode pattern 313 is formed by partially removing of the transparent conductive film 313' (FIG. 6(e)). Since the method of selectively removing the ITO thin film 313' to form the electrode pattern is the same as that for a conventional capacitive touch sensor, detailed description thereof will be omitted.

Afterwards, the conductive wiring layer 314 is formed on the edges of the transparent electrode pattern 313 in the area where the decorative layer 312 is disposed (FIG. 6(f)). The wiring layer 314 is formed by the silk screen printing of conductive film. Specifically, the wiring layer 314 is formed by printing silver paste using a printing facility and by use of a mask printed on a silk screen. The line width of the wiring layer 314 ranges from 50 to 200 micrometers. Alternatively, the wiring layer might be formed by depositing metallic thin film under vacuum environment and a subsequent photolithographic process. In such a case, the line width of the wiring may range from 5 to 100 micrometers.

The anti-reflection layer 315 is formed on the electrode pattern 313 as shown in FIG. 6(g). Because the refraction indices of the transparent electrode pattern 313 and the window panel substrate 311 are different from each other, the electrode pattern of the window area W can be seen from the outside unless any coating is added. Thus, it is needed to perform a low reflection coating for making the electrode pattern 313 invisible and increasing light transmission ratio. The low reflection coating is achieved by the sputtering or the vacuum evaporation. The anti-reflection layer is formed by use of material such as titanium dioxide ($TiO_2$), silicon dioxide ($SiO_2$), magnesium fluoride ($MgF_2$), and so on. A stacked structure of 2-layer or 4-layer composed of the titanium dioxide ($TiO_2$) and the silicon dioxide ($SiO_2$) may be used as well for the anti-reflection layer 315.

In case that the window panel substrate is made of tempered glass, the scattering prevention layer 316 is coated in order to protect the transparent electrode pattern layer 313 and the wiring layer 314 and prevent the shards of the broken window panel from being scattered away when the window panel substrate 311 is broken. The scattering prevention layer 311 can be formed by coating thermosetting resin and drying at 80° C. for 60 minutes.

Finally, the PCB 317 is connected to an unillustrated terminal of the conductive electrode pattern layer 314.

The process of the present embodiment provides a touch sensor integrated with window panel can be made by a simplified process. In particular, the removal of the process step of bonding the window panel and the touch sensor can enhance the fabrication productivity. Further, the elimination of the adhesive layer (PSA layer) allows thinner thickness and superior light transmission characteristics of the window panel integrated touch sensor. Additionally, the removal of the process step of bonding the window panel and the touch sensor prevents the defects due to the air bubbles, the contaminants, or the misalignment problem.

Having described and illustrated the process for manufacturing a single touch sensor in the preferred embodiment, the fabrication of a plurality of touch sensors simultaneously on a large scale plate is apparent to a person skilled in the art based on the forgoing description and the attached drawings.

Thus, it should be understood that the embodiments described in the forgoing description and the attached drawings are not restrictive but illustrative. Those of ordinary skill in the art will appreciate that many obvious changes and modifications can be made to the invention without departing from its spirit or essential characteristics. Accordingly, the scope of the invention should be interpreted in the light of the following appended claims.

INDUSTRIAL APPLICABILITY

The touch sensor integrated with window panel according to the present invention can be employed in portable electronic devices such as a cellular phone, a camera, and so on as an input unit. The touch sensor according to the present invention is advantageous in that it can make the portable electronic device thinner and enhance the light transmission characteristics.

The invention claimed is:

1. A method of manufacturing a capacitive touch sensor integrated with a window panel, comprising:
   providing a transparent window panel substrate;
   providing a non-conductive opaque decorative layer on a surface of the window panel substrate along edges of the surface to define a transparent window area over the window panel substrate;
   coating a transparent conductive electrode thin film integrally over the window area and the decorative layer;
   forming a transparent conductive electrode pattern by partially removing the conductive electrode thin film;
   coating a conductive wiring layer at an edge of the transparent conductive electrode pattern; and
   coating an anti-reflection layer over the transparent electrode pattern and the conductive wiring layer.

2. The method of claim 1, wherein coating the transparent electrode thin film comprises sputtering an oxide selected from a group consisting of ITO, IZO, ZnO, and CTO.

3. The method of claim 1, further comprising coating a scattering prevention layer on the anti-reflection layer.

4. The method of claim 3, wherein providing the non-conductive opaque decorative layer comprises:
   coating a non-conductive metallic alloy layer or a non-conductive metallic oxide layer on one side of the window panel substrate;
   coating non-conductive ink on the non-conductive metallic alloy layer or the metallic oxide layer in a decoration region so as to define the window area over the window panel substrate; and
   etching away the metallic alloy layer or the non-conductive metallic oxide layer coated on the window area.

5. The method of claim 1, wherein providing the non-conductive opaque decorative layer comprises:
   coating a non-conductive metallic alloy layer or a non-conductive metallic oxide layer on one side of the window panel substrate;
   coating non-conductive ink on the non-conductive metallic alloy layer or the metallic oxide layer in a decoration region so as to define the window area over the window panel substrate; and
   etching away the metallic alloy layer or the non-conductive metallic oxide layer coated on the window area.

6. The method of claim 5, wherein the non-conductive metallic oxide contains titanium dioxide (TiO2) or silicon dioxide (SiO2).

7. The method of claim 5, wherein the non-conductive metallic alloy contains tin or silicon aluminum alloy.

8. The method of claim 1, further comprising, before coating the transparent conductive electrode thin film, coating a SiO2 layer.

9. The method of claim 8, wherein providing the non-conductive opaque decorative layer comprises:
   coating a non-conductive metallic alloy layer or a non-conductive metallic oxide layer on one side of the window panel substrate;
   coating non-conductive ink on the non-conductive metallic alloy layer or the metallic oxide layer in a decoration region so as to define the window area over the window panel substrate; and
   etching away the metallic alloy layer or the non-conductive metallic oxide layer coated on the window area.

10. A method of manufacturing a capacitive touch sensor integrated with a window panel, comprising:
    providing a transparent window panel substrate;
    providing a non-conductive opaque decorative layer on a surface of the window panel substrate along edges of the surface to define a transparent window area over the window panel substrate, wherein the step of providing the non-conductive opaque decorative layer comprises,
       coating a non-conductive metallic alloy layer or a non-conductive metallic oxide layer on one side of the window panel substrate,
       coating non-conductive ink on the non-conductive metallic alloy layer or the metallic oxide layer in a decoration region so as to define the transparent window area over the window panel substrate, and
       etching away the non-conductive metallic alloy layer or the non-conductive metallic oxide layer coated on the transparent window area;
    coating a transparent conductive electrode thin film over the window area and the decorative layer;
    forming a transparent conductive electrode pattern by partially removing the conductive electrode thin film; and
    coating a conductive wiring layer at an edge of the transparent conductive electrode pattern.

* * * * *